US008638485B2

(12) United States Patent
Feng et al.

(10) Patent No.: US 8,638,485 B2
(45) Date of Patent: Jan. 28, 2014

(54) INTEGRATION OF COMPONENTS ON OPTICAL DEVICE

(75) Inventors: Dazeng Feng, El Monte, CA (US); Mehdi Asghari, Pasadena, CA (US)

(73) Assignee: Kotura, Inc., Monterey Park, CA (US)

( * ) Notice: Subject to any disclaimer, the term of this patent is extended or adjusted under 35 U.S.C. 154(b) by 0 days.

(21) Appl. No.: 13/385,774

(22) Filed: Mar. 5, 2012

(65) Prior Publication Data

US 2013/0229701 A1 Sep. 5, 2013

(51) Int. Cl.
*G02B 26/00* (2006.01)
(52) U.S. Cl.
USPC .......................................... 359/238; 372/50.1
(58) Field of Classification Search
USPC ............. 359/237–324; 385/1–14; 372/26–28, 372/34, 38.01, 109, 50.1
See application file for complete search history.

(56) References Cited

U.S. PATENT DOCUMENTS

| 5,165,105 A * | 11/1992 | Haase et al. ................. 385/8 |
| 6,597,718 B2 * | 7/2003 | Tanbun-Ek et al. ....... 372/50.11 |
| 2003/0012244 A1 * | 1/2003 | Krasulick et al. ............ 372/50 |

OTHER PUBLICATIONS

Jifeng Liu, Dong Pan, Samerkhae Jongthammanurak, Kazumi Wada, Lionel C. Kimerling, and Jurgen Michel, "Design of monolithically integrated GeSi electro-absorption modulators and photodetectors on a SOI platform", Optics Express, vol. 15, Issue 2, pp. 623-628 (2007).*

* cited by examiner

*Primary Examiner* — Ricky Mack
*Assistant Examiner* — Gary O'Neill
(74) *Attorney, Agent, or Firm* — Gavrilovich, Dodd & Lindsey, LLP

(57) ABSTRACT

The optical device includes a Fabry-Perot laser positioned on a base. A modulator is also positioned on the base so as to receive the output from the laser. The modulator is a Franz-Keldysh modulator that uses the Franz-Keldysh effect to modulate light signals. The laser and modulator are configured such that the modulator modulates the output from the laser and also such that the temperature dependence of the modulator tracks the temperature dependence of the laser.

16 Claims, 12 Drawing Sheets

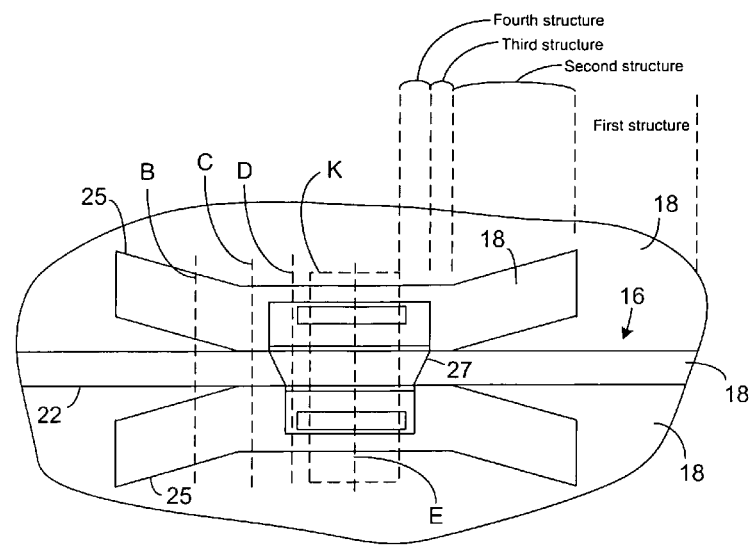
Figure 2A
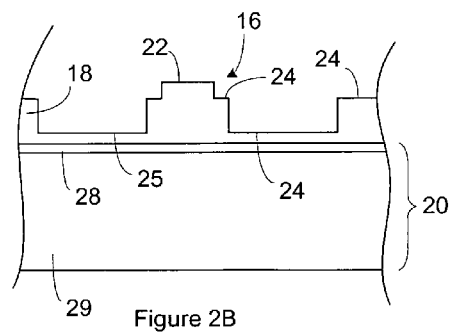
Figure 2B
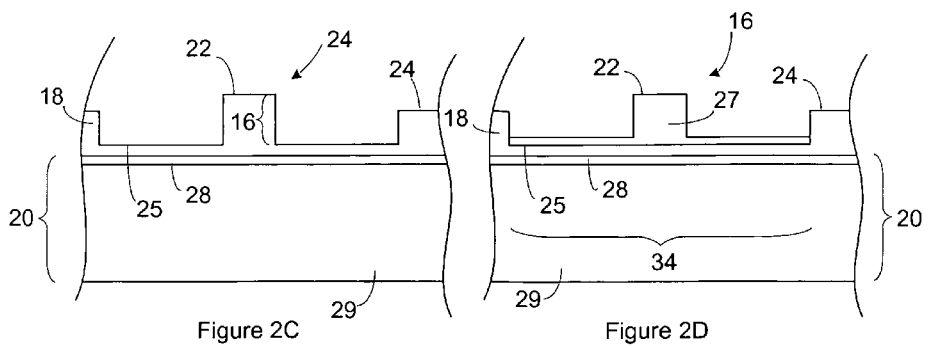
Figure 2C
Figure 2D

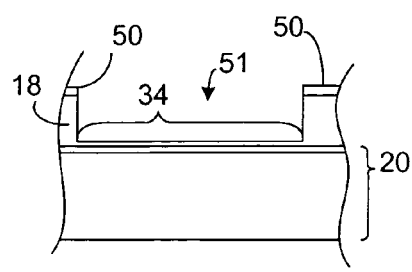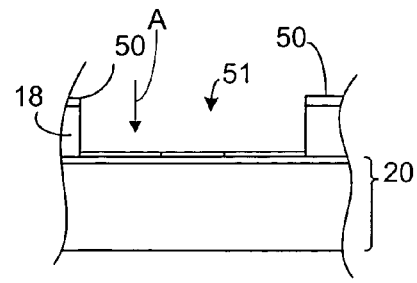
Figure 4A            Figure 4B
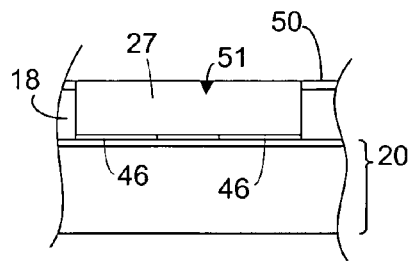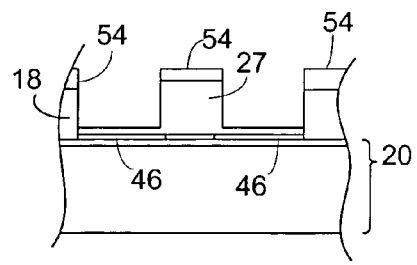
Figure 4C            Figure 4D
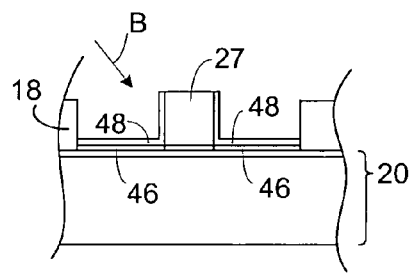
Figure 4E

INTEGRATION OF COMPONENTS ON OPTICAL DEVICE

FIELD

The present invention relates to optical devices and particularly, to optical devices that include multiple optical components.

BACKGROUND

As the use of optical device in communications applications has increased, there is an increasing demand for the integration of multiple components onto a single device. For instance, there is a demand for devices that include a laser that acts as a source of a light signal and one or more modulators for modulating the light signal. However, different optical components such as lasers and modulators use different material systems that cause them to respond to temperature changes differently. As a result, two components may operate well together at one temperature but fail to operate together at another temperature.

One method of addressing these changes has been to attempt to control the device's environment through the use of temperature control systems that hold the temperature of the device at a constant value or that hold the temperature of particular components at a particular value. However, the temperature control systems add cost and complexity to the device. As a result, there is a need for optical device that integrates multiple optical components and can be used in a variety of temperature conditions.

SUMMARY

The optical device includes a Fabry-Perot laser positioned on a base. A modulator is also positioned on the base so as to receive the output from the laser. The modulator is a Franz-Keldysh modulator that uses the Franz-Keldysh effect to modulate light signals. The materials and material ratios of the laser and modulator are selected such that the modulator can modulate the output from the laser and also such that the temperature dependence of the modulator tracks the temperature dependence of the laser.

BRIEF DESCRIPTION OF THE FIGURES

FIG. 1A is a perspective view of the device.

FIG. 1B is a cross section of the device taken along the line labeled B in FIG. 1A.

FIG. 2A through FIG. 2E illustrate construction of a modulator that is suitable for use as the modulator of FIG. 1A. FIG. 2A is a topview of the portion of the optical device shown in FIG. 1A that includes an optical modulator.

FIG. 2B is a cross-section of the optical device shown in FIG. 1A taken along the line labeled B.

FIG. 2C is a cross-section of the optical device shown in FIG. 1A taken along the line labeled C.

FIG. 2D is a cross-section of the optical device shown in FIG. 1A taken along the line labeled D.

FIG. 2E is a cross-section of the optical device shown in FIG. 1A taken along the line labeled E.

FIG. 4A through FIG. 4E illustrate a method of forming the modulator of FIG. 3.

FIG. 9A is a bottom view of the laser.

FIG. 9B is a cross-section of the laser shown in FIG. 9A taken along the line labeled B in FIG. 9A.

FIG. 9C is a cross-section of the laser shown in FIG. 9A taken along the line labeled C in FIG. 9A.

FIG. 9D is a topview of the laser.

DESCRIPTION

Figure 1A:
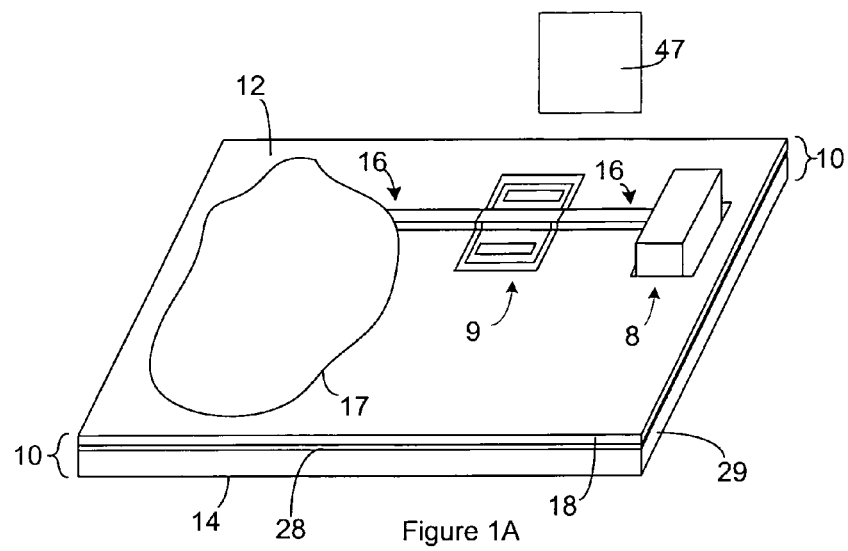
FIG. 1A and FIG. 1B illustrates an optical device having a waveguide that guides a light signal between a laser and a modulator.

An optical device includes one or more lasers that act as a source of one or more light signals. The device also includes one or more modulators that each modulates one of the light signals. The modulator is a Franz-Keldysh modulator and the laser is a Fabry-Perot laser. Although these lasers and modulators use different material systems, the Applicant has found that particular material systems can be adjusted so the laser and modulator operate at the same wavelength for a particular temperature.

What the Applicant did not expect from combining a Franz-Keldysh modulator and a Fabry-Perot laser with wavelength matched material systems was that the temperature dependence of the modulator tracked the temperature dependence of the laser over a surprisingly large range of temperatures. Since the temperature dependency of these components tracked over a large range of temperatures, the components continue to work together at different temperatures. As a result, when these two components employ particular materials systems that are wavelength matched, they can be integrated onto a single optical device without the need for temperature control devices.

The Applicant is unsure of the source of the common temperature dependence of Franz-Keldysh modulator and a Fabry-Perot laser employing certain wavelength matched material systems. One source for the temperature dependence of these components is the change in the index of refraction caused by temperature changes. However, these temperature changes also cause a shift in the band gap of a material. Since Franz-Keldysh modulators modulate the material band gap, the effect of temperature on the band gap of the material directly affects the wavelength at which these modulators operate. What is surprising is that the effect of temperature changes on this band gap appears to cause the temperature dependence of Franz-Keldysh modulator to track the temperature dependence of Fabry-Perot lasers.

This tracking of the temperature dependence of a Franz-Keldysh modulator and a Fabry-Perot laser is even more surprising when it is recognized that Fabry-Perot lasers do not have wavelength set by a wavelength selecting device such as an optical grating as occurs in Distributed Bragg Reflector lasers (DBR lasers) or Distributed FeedBack lasers (DFB lasers). Since Fabry-Perot lasers do not have wavelength selecting devices, the wavelength output by these lasers is dependent on the response of the gain medium to temperature changes. Accordingly, the wavelength output by Fabry-Perot lasers can be even more strongly temperature dependent than other laser types. The enhanced temperature dependence of Fabry-Perot lasers would indicate that it is even less likely that the temperature dependence of these lasers would track the performance of a component using a different material system. As a result, the ability of the Franz-Keldysh modulator to track the temperature dependence of a Fabry-Perot laser was unexpected. The fact that this occurs with a Fabry-Perot laser is highly beneficial because of the ease and affordability of fabricating these types of lasers.

Figure 1B:
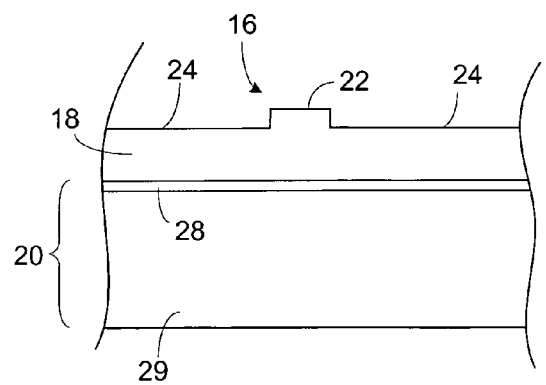

FIG. 1A and FIG. 1B illustrates an optical device having a waveguide that guides a light signal between a laser 8 and a modulator 9. FIG. 1A is a perspective view of the device.

FIG. 1B is a cross section of the device taken along the line labeled B in FIG. 1A. FIG. 1A and FIG. 1B do not show details of either the laser or the modulator but illustrates the relationship between these components and the waveguide.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act as a source of a light signal, amplifiers for amplifying the intensity of a light signal, attenuators for attenuating the intensity of a light signal, modulators for modulating a signal onto a light signal, modulators that convert a light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

A portion of the waveguide includes a first structure where a portion of the waveguide 16 is defined in a light-transmitting medium 18 positioned on a base 20. For instance, a portion of the waveguide 16 is partially defined by a ridge 22 extending upward from a slab region of the light-transmitting medium as shown in FIG. 1B. In some instances, the top of the slab region is defined by the bottom of trenches 24 extending partially into the light-transmitting medium 18 or through the light-transmitting medium 18. Suitable light-transmitting media include, but are not limited to, silicon, polymers, silica, SiN, GaAs, InP and LiNbO$_3$. One or more cladding layers (not shown) are optionally positioned on the light-transmitting medium 18. The one or more cladding layers can serve as a cladding for the waveguide 16 and/or for the device. When the light-transmitting medium 18 is silicon, suitable cladding layers include, but are not limited to, polymers, silica, SiN, GaAs, InP and LiNbO$_3$.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be a light insulator 28 with a lower index of refraction than the light-transmitting medium 18. The drop in the index of refraction can cause reflection of a light signal from the light-transmitting medium 18 back into the light-transmitting medium 18. The base 20 can include the light insulator 28 positioned on a substrate 29. As will become evident below, the substrate 29 can be configured to transmit light signals. For instance, the substrate 29 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the light insulator 28 and the silicon substrate can serve as the substrate 29.

Figure 2E:
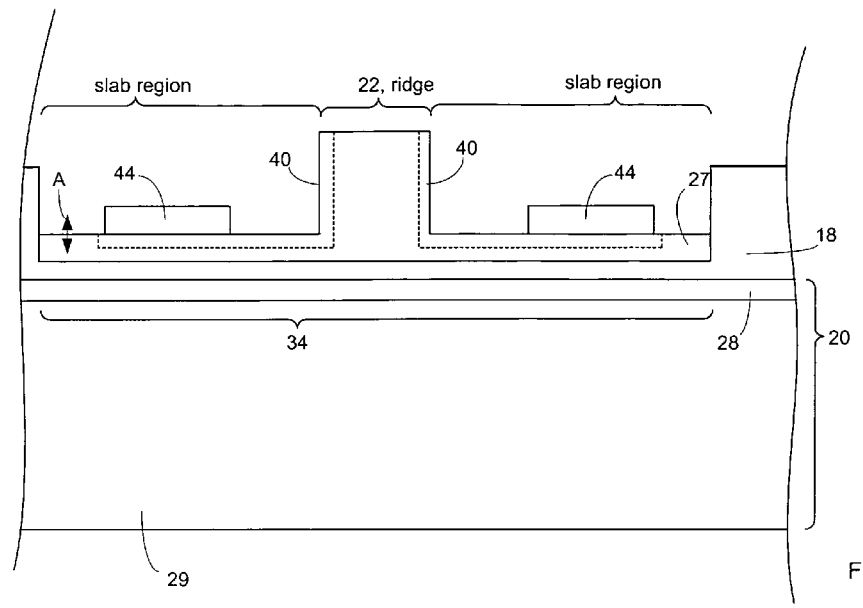

FIG. 2A through FIG. 2E illustrate construction of a modulator that is suitable for use as the modulator of FIG. 1A. FIG. 2A is a topview of the portion of the optical device shown in FIG. 1A that includes an optical modulator. FIG. 2B is a cross-section of the optical device shown in FIG. 1A taken along the line labeled B. FIG. 2C is a cross-section of the optical device shown in FIG. 1A taken along the line labeled C. FIG. 2D is a cross-section of the optical device shown in FIG. 1A taken along the line labeled D. FIG. 2E is a cross-section of the optical device shown in FIG. 1A taken along the line labeled E.

Recesses 25 (FIG. 2A) extend into the slab regions such that the ridge 22 is positioned between recesses 25. The recesses 25 can extend part way into the light-transmitting medium 18. As is evident from FIG. 2B, the recesses 25 can be spaced apart from the ridge 22. As a result, a portion of the waveguide 16 includes a second structure where an upper portion of the waveguide 16 is partially defined by the ridge 22 extending upward from the slab region and a lower portion of the waveguide is partially defined by recesses 25 extending into the slab regions and spaced apart from the ridge.

As shown in FIG. 2C, the recesses 25 can approach the ridge 22 such that the sides of the ridge 22 and the sides of the recesses 25 combine into a single surface 26. As a result, a portion of a waveguide includes a third structure where the waveguide is partially defined by the surface 26.

As is evident in FIG. 2A, a portion of the waveguide includes an electro-absorption medium 27. The electro-absorption medium 27 is configured to receive the light signals from a portion of the waveguide having the third structure and to guide the received light signals to another portion of the waveguide having the third structure.

In FIG. 2D, a ridge 22 of electro-absorption medium 27 extends upward from a slab region of the electro-absorption medium 27. Accordingly, a portion of a waveguide includes a fourth structure where the waveguide is partially defined by the top and lateral sides of the electro-absorption medium 27. The slab regions of the electro-absorption medium 27 and the ridge 22 of the electro-absorption medium 27 are both positioned on a seed portion 34 of the light-transmitting medium 18. As a result, the seed portion 34 of the light-transmitting medium 18 is between the electro-absorption medium 27 and the base 20. In some instances, when the light signal travels from the light-transmitting medium into the electro-absorption medium 27, a portion of the light signal enters the seed portion 34 of the light-transmitting medium 18 and another portion of the light signal enters the electro-absorption medium 27. As described above, the electro-absorption medium 27 can be grown on the seed portion of the light-transmitting medium 18.

As is evident in FIG. 2A, there is an interface between each facet of the electro-absorption medium 27 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The optical device includes a modulator. The location of the modulator on the optical device is illustrated by the line labeled K in FIG. 2A. In order to simplify FIG. 2A, the details of the modulator construction are not shown in FIG. 2A. However, the modulator construction is evident from other illustrations such as FIG. 2E. The modulator of FIG. 2E is constructed on the portion of the waveguide having a fourth structure constructed according to FIG. 2D. The perimeter of portions of doped regions shown in FIG. 2E are illustrated with dashed lines to prevent them from being confused with interfaces between different materials. The interfaces between different materials are illustrated with solid lines. The modulator is configured to apply an electric field to the electro-absorption medium 27 in order to phase and/or intensity modulate the light signals received by the modulator.

A ridge 22 of the electro-absorption medium 27 extends upward from a slab region of the electro-absorption medium 27. Doped regions 40 are both in the slab regions of the electro-absorption medium 27 and also in the ridge of the electro-absorption medium 27. For instance, doped regions 40 of the electro-absorption medium 27 are positioned on the lateral sides of the ridge 22 of the electro-absorption medium 27. In some instances, each of the doped regions 40 extends up to the top side of the electro-absorption medium 27 as shown in FIG. 2E. Additionally, the doped regions 40 extend away from the ridge 22 into the slab region of the electro-absorption medium 27. The transition of a doped region 40 from the ridge 22 of the electro-absorption medium 27 into the slab region of the electro-absorption medium 27 can be continuous and unbroken as shown in FIG. 2E.

Each of the doped regions 40 can be an N-type doped region or a P-type doped region. For instance, each of the N-type doped regions can include an N-type dopant and each of the P-type doped regions can include a P-type dopant. In some instances, the electro-absorption medium 27 includes a doped region 40 that is an N-type doped region and a doped region 40 that is a P-type doped region. The separation between the doped regions 40 in the electro-absorption medium 27 results in the formation of PIN (p-type region-insulator-n-type region) junction in the modulator.

In the electro-absorption medium 27, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$. A suitable concentration for the N-type dopant in an N-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$.

Electrical conductors 44 are positioned on the slab region of the electro-absorption medium 27. In particular, the electrical conductors 44 each contact a portion of a doped region 40 that is in the slab region of the electro-absorption medium 27. Accordingly, the each of the doped regions 40 is doped at a concentration that allows it to provide electrical communication between an electrical conductor 44 and one of the doped regions 40 in the electro-absorption medium 27. As a result, electrical energy can be applied to the electrical conductors 44 in order to apply the electric field to the electro-absorption medium 27. The region of the light-transmitting medium or electro-absorption medium between the doped regions can be undoped or lightly doped as long as the doping is insufficient for the doped material to act as an electrical conductor that electrically shorts the modulator.

During operation of the modulators of FIG. 1A through FIG. 2E, electronics 47 (FIG. 1A) can be employed to apply electrical energy to the electrical conductors 44 so as to form an electrical field in the electro-absorption medium 27. For instance, the electronics can form a voltage differential between the doped regions that act as a source of the electrical field in the gain medium. The electrical field can be formed without generating a significant electrical current through the electro-absorption medium 27. The electro-absorption medium 27 can be a medium in which the Franz-Keldysh effect occurs in response to the application of the electrical field. The Franz-Keldysh effect is a change in optical absorption and optical phase by an electro-absorption medium 27. For instance, the Franz-Keldysh effect allows an electron in a valence band to be excited into a conduction band by absorbing a photon even though the energy of the photon is below the band gap. To utilize the Franz-Keldysh effect the active region can have a slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the electro-absorption medium 27 can absorb light signals received by the electro-absorption medium 27 and increasing the electrical field increases the amount of light absorbed by the electro-absorption medium 27. Accordingly, the electronics can tune the electrical field so as to tune the amount of light absorbed by the electro-absorption medium 27. As a result, the electronics can intensity modulate the electrical field in order to modulate the light signal. Additionally, the electrical field needed to take advantage of the Franz-Keldysh effect generally does not involve generation of free carriers by the electric field.

Suitable electro-absorption media 27 for use in the modulator include semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

Modulators having a cross section according to 2E can be used in configurations other than the configuration of FIG. 1A through 2E. Additional details about the fabrication, structure and operation of a modulator having a cross section according to FIG. 2E can be found in U.S. patent application Ser. No. 12/653,547, filed on Dec. 15, 2009, entitled "Optical Device Having Modulator Employing Horizontal Electrical Field," and incorporated herein in its entirety.

A modulator having a cross section according to FIG. 2E can be sensitive to the thickness of the slab regions of the electro-absorption medium 27. For instance, as the thickness of the slab region increases, the ridge becomes smaller and the electrical field formed between the doped regions 40 accordingly fills a smaller portion of the distance between the base 20 and the top of the ridge. For instance, the location of the electrical field effectively moves upwards from the base 20. The increased space between the electrical field and the base 20 can be thought of as increasing the resistance or carrier diffusion time of the modulator. This increase in resistance and/or diffusion time decreases the speed of the modulator. Problems also occur when these slab regions become undesirably thin. When these slab regions become thin, the doped regions extend down into the light-transmitting medium 18. This doping of the light-transmitting medium 18 also decreases the speed of the modulator.

Figure 3:
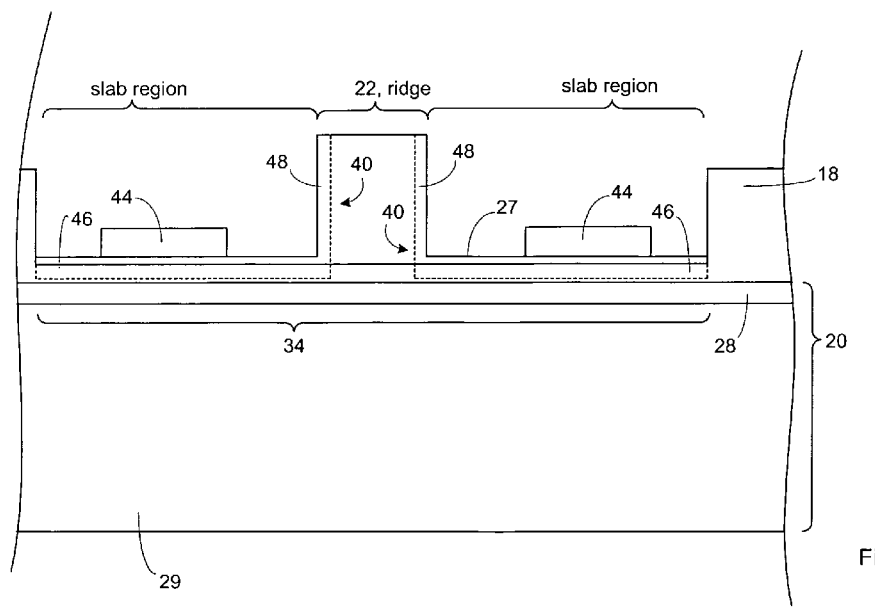
FIG. 3 is a cross section of an embodiment of a modulator having a reduced sensitivity to the thickness of the slab regions on opposing sides of a waveguide.

FIG. 3 presents an embodiment of a modulator having a reduced sensitivity to the thickness of the slab regions. The perimeter of portions of doped regions shown in FIG. 3 are illustrated with dashed lines to prevent them from being confused with interfaces between different materials. The interfaces between different materials are illustrated with solid lines. A first doped zone 46 and a second doped zone 48 combine to form each of the doped regions 40. In some instance, the first doped zone 46 is located in the light-transmitting medium 18 but not in the electro-absorption medium 27 and the second doped zone 48 is located in the electro-absorption medium 27. The first doped zone 46 can contact the second doped zone 48 or can overlap with the second doped zone 48. In some instances, the first doped zone 46 and the second doped zone 48 overlap and at least a portion of the overlap is located in the light-transmitting medium 18. In other instances, the first doped zone 46 and the second doped zone 48 overlap without any overlap being present in the electro-absorption medium 27.

The first doped zone 46 and the second doped zone 48 included in the same doped region 40 each includes the same type of dopant. For instance, the first doped zone 46 and the second doped zone 48 in an n-type doped region 40 each includes an n-type dopant. The first doped zone 46 and the second doped zone 48 included in the same doped region 40 can have the same dopant concentration or different concentrations.

Although FIG. 3 illustrates the slab regions including the electro-absorption medium 27, the slab regions of the electro-absorption medium 27 may not be present. For instance, the etch that forms the slab regions of the electro-absorption medium 27 may etch all the way through the slab regions. In these instances, the first doped zone 46 and the second doped zone 48 are both formed in the light-transmitting medium.

Although FIG. 3 shows the first doped zone 46 not extending down to the light insulator 28, the first doped zone 46 can extend down to the light insulator 28 or into the light insulator 28.

The optical device of FIG. 3 can be constructed using fabrication technologies that are employed in the fabrication of integrated circuits, optoelectronic circuits, and/or optical devices. FIG. 4A through FIG. 4E illustrate a method of forming the modulator of FIG. 3. The method is illustrated using a silicon-on-insulator wafer or chip as the starting precursor for the optical device. However, the method can be adapted to platforms other than the silicon-on-insulator platform.

FIG. 4A illustrate a first mask 50 formed on a silicon-on-insulator wafer or chip to provide a device precursor. FIG. 4A is a cross-section of the device precursor. The first mask 50 leaves exposed a region of the device precursor where an active cavity 51 is to be formed while the remainder of the illustrated portion of the device precursor is protected. The active cavity 51 is the region of the device precursor where the electro-absorption medium 27 will be formed. A first etch is then performed so as to form the active cavity 51. The first etch yields the device precursor of FIG. 4A. The first etch is performed such that the seed portion 34 of the light-transmitting medium 18 remains on the base 20. Accordingly, the first etch is terminated before the base 20 is reached.

A suitable first mask 50 includes, but is not limited to, a hard mask such as a silica mask. A suitable first etch includes, but is not limited to, a dry etch.

The n-type first doped zone 46 and the p-type first doped zone 46 are serially formed in the light-transmitting medium at the bottom of the active cavity 51 to provide the device precursor of FIG. 4B. Suitable methods of forming the first doped zones 46 include, but are not limited to, dopant implantation. The n-type first doped zone 46 can be masked during the formation of the p-type first doped zone and the p-type first doped zone 46 can be masked during the formation of the n-type first doped zone. As illustrated by the arrow labeled A in FIG. 4A, the direction of the dopant implantation during the formation of the first doped zones 46 can be substantially perpendicular to the surface of the light-transmitting medium at the bottom of the active cavity 51.

In some instances, the device precursor is annealed after the formation of the first doped zones 46. A suitable annealing temperature includes temperatures greater than 950° C., 1000° C., or 1050° C. and/or less than 1100° C., 1150° C., or 1200° C.

After annealing, the electro-absorption medium 27 is formed in the active cavity 51 of FIG. 4B so as to provide the device precursor of FIG. 4C. When the light-transmitting medium 18 is silicon and the electro-absorption medium 27 is germanium or germanium-silicon, the active absorption medium 27 can be grown on the seed portion 34 of the light-transmitting medium.

After formation of the electro-absorption medium 27, the first mask 50 can be removed and the device precursor can be planarized. Suitable planarization methods include, but are not limited to, a chemical-mechanical polishing (CMP) process.

A second mask 52 can be formed on the device precursor as shown on the device precursor of FIG. 4D. The second mask 52 is formed such that the regions where the ridge of the electro-absorption medium 27 is to be formed is protected while the remainder of the electro-absorption medium 27 remains exposed. The portion of the second mask 52 that is protecting the region of the device precursor where the ridge is to be formed can extend over a portion of one or more of the first doped zones. For instance, FIG. 4D shows the second mask being located over a portion of each of the first doped zones. A suitable second mask 52 includes a hard mask such as a silica mask. A second etch is performed so as to form the ridge in the electro-absorption medium as shown in the device precursor of FIG. 4D. Since the second mask 52 is shown as being located over a portion of each one of the first doped zones, the second mask forms the ridge such that a portion of each first doped zone is located under the ridge. In other instances, the portion of the second mask 52 that is protecting the region of the device precursor where the ridge is to be formed does not extend over any portion of the one or more first doped zones.

Although FIG. 4D shows the second etch leaving slab regions of the electro-absorption medium 27 next to the ridge of electro-absorption medium 27, the second etch can be performed until there is no electro-absorption medium 27 next to the ridge of electro-absorption medium. For instance, the second can etch through the electro-absorption medium 27 to the light-transmitting medium 18. As a result, the underlying light-transmitting medium 18 can define the top of the slab region. In some instances, the second can etch into through the electro-absorption medium 27 and into the light-transmitting medium 18. In this instance, the underlying light-transmitting medium 18 can define the top of the slab region. A suitable second etch includes, but is not limited to, a dry etch.

The n-type second doped zone 48 and the p-type second doped zone 48 are serially formed in the electro-absorption medium 27 included in the ridge of the electro-absorption medium and also in the adjacent slabs. When the second etch is performed such that there are slab regions of the electro-absorption medium 27 adjacent to the ridge of electro-absorption medium 27, the second doped zones are also formed in the slab regions of the electro-absorption medium 27 as shown in FIG. 4E. When the second etch is performed such that slab regions of the electro-absorption medium 27 are not present adjacent to the ridge of electro-absorption medium 27, the second doped zones can also be formed in the underlying material. For instance, when the second etch is performed such that slab regions of the electro-absorption medium 27 are not present adjacent to the ridge, the second doped zones can also be formed in the underlying light-transmitting medium 18. Since two different doped zones combine to form the portion of each doped region that is located in the slab region but essentially a single doped zone forms the portion of the region that is located in the ridge, each doped region can extend further into the slab region that it extends into the ridge.

Suitable methods of forming the second doped zones 48 include, but are not limited to, dopant implantation. Although not shown, the n-type second doped zone 48 can be masked during the formation of the p-type second doped zone 48 and the p-type second doped zone 48 can be masked during the formation of the n-type second doped zone 48. As illustrated by the arrow labeled B in FIG. 4E, the direction of the dopant implantation during the formation of the second doped zones 48 can be angled such that the doping for the second doped zone 48 occurs both in the ridge and in the material(s) located adjacent to the ridge and at the bottom of the active cavity 51. The electrical conductors 44 can be added to the device precursor of FIG. 4E to provide the modulator of FIG. 2E. A comparison of FIG. 4E with FIG. 2E shows that a first doped zone 46 and a second doped zone 48 from FIG. 4E combine to serves as each one of the doped regions of FIG. 2E.

As is evident from the above method, the device can be annealed between forming the first doped zones 46 and forming the electro-absorption medium 27 on the light-transmitting medium 18. Light-transmitting media 18 such as silicon can be annealed at higher temperature than electro-absorption media 27 such as germanium or $Ge_{1-x}Si_x$. For instance, silicon can be annealed at around 1000° C. where $Ge_{1-x}Si_x$ can generally be annealed at around 600° C. Accordingly, annealing the device precursor before forming the electro-absorption medium 27 allows the device precursor to be annealed at a higher temperature that would occur by annealing the device precursor after forming the electro-absorption medium 27. Annealing at higher temperatures activates a larger portion of the dopant and accordingly results in a doped region with a lower resistance than would occur as a result of annealing at lower temperatures. As a result, the doped regions formed in the light-transmitting medium 18 can have a lower resistance than when doped regions are formed in the light-transmitting medium 18 after the electro-absorption medium 27 is grown on the device.

Since the above method can reduce the resistance of the portion of a doped region 40 in the electro-absorption medium, the slab regions of the electro-absorption medium 27 can be very thin or even altogether removed without undesirably slowing the speed of the modulator. Accordingly, the second etch can be an intentional over-etch relative to the modulator of FIG. 2E. Successful application of an over-etch is assisted by the slower etch rate of Si compared to Ge. The duration of the second etch can be longer than the etch that is associated with generating slab regions of electro-absorption medium 27 with the thickness of FIG. 2E. A benefit of intentionally over-etching during the second etch can also the elimination of undesirably thick electro-absorption medium 27 slab regions. As a result, the method of FIG. 4A through FIG. 4E provides a modulator that is not strongly dependent on the thickness of the slab regions. Without this dependence, the effects of inconsistent etching results do not affect the device fabrication and there is less waste in the fabrication process.

Figure 5:
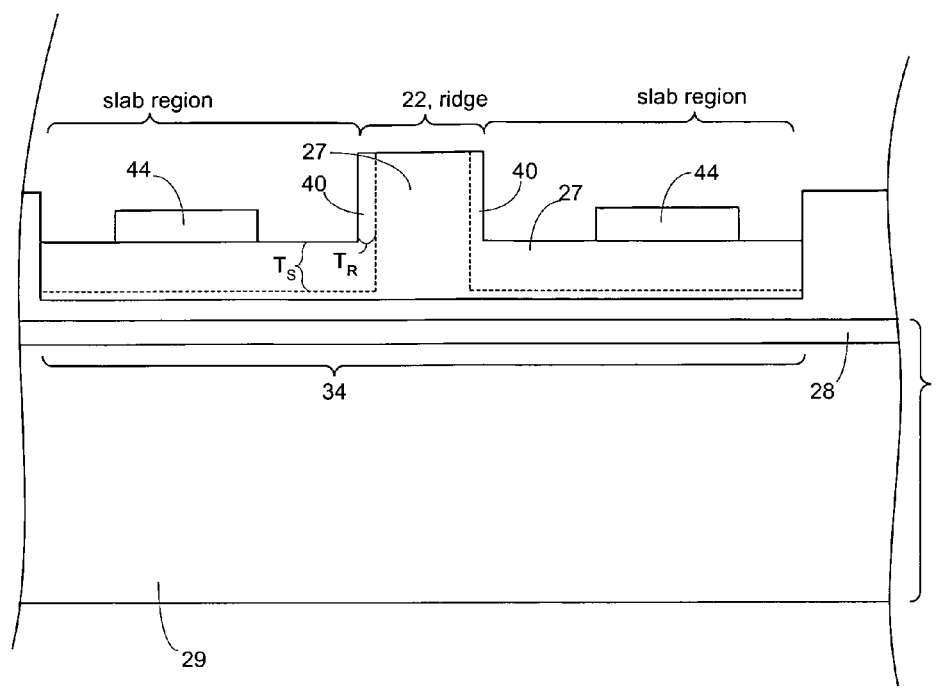
FIG. 5 is a cross section of another embodiment of a modulator having a reduced sensitivity to the thickness of the slab regions.

FIG. 5 presents another embodiment of a modulator having a reduced sensitivity to the thickness of the slab regions. The perimeter of portions of doped regions shown in FIG. 5 are illustrated with dashed lines to prevent them from being confused with interfaces between different materials. The interfaces between different materials are illustrated with solid lines.

The doped regions 40 each includes a portion that extends into the ridge of electro-absorption medium 27 and another portion that extends into the slab region of the electro-absorption medium 27. The doped region 40 extends further into the slab region of the electro-absorption medium than the doped region extends into the ridge of the electro-absorption medium. For instance, the portion of each doped region 40 in the slab region of the electro-absorption medium 27 is thicker than the portion in the ridge. Reducing the extension of the doped region into the ridge reduces the interaction between the doped region and a light signal being guided through the ridge. As a result, a reduced extension of the doped region into the ridge reduces optical loss. Extending the doped region further into the slab regions allows the electrical field formed between the doped regions to move closer to the base. As a result, the extension of the doped regions further into the slab increases the portion of the light signal that interacts with the electrical field. Accordingly, problems associated with increasing the thickness of the slab regions do not arise because they can be addressed by extending the doped regions 40 further into the slab regions.

A suitable thickness for the portion of the doped region 40 in the ridge (labeled $T_R$ in FIG. 5) includes a thickness greater than 0.01, 0.075, 0.1, or 0.125 μm and/or less than 0.175, 0.2, or 0.5 μm. A suitable thickness for the portion of the doped region 40 in the slab region of the electro-absorption medium 27 (labeled $T_S$ in FIG. 5) includes a thickness greater than 0.175, 0.2, or 0.225 μm and/or less than 0.275, 0.3, 0.325, or 0.8 μm. A suitable thickness ratio (ratio of thickness of portion of doped region in the slab region: thickness of portion of doped region in the ridge) includes ratios greater than 1, 1.25, or 1.5 and/or less than 2.0, 2.5, and 3.

The doped regions 40 can each be a result of combining a first doped zone (not shown in FIG. 5) and a second doped zone (not shown in FIG. 5). The first doped zone can be located in the slab region of the electro-absorption medium and the second doped zone can be located both in the ridge and in the slab region of the electro-absorption medium 27. The first doped zone and the second doped zone included in the same doped region 40 each includes the same type of dopant. For instance, the first doped zone and the second doped zone in an n-type doped region 40 each includes an n-type dopant. The first doped zone and the second doped zone included in the same doped region can have the same dopant concentration or different concentrations. Additionally, the first doped zone can contact the second doped zone so as to form the doped region 40 or can overlap with the second doped zone 48 so as to form the doped region 40. In some instances, the first doped zone and the second doped zone overlap and at least a portion of the overlap is located in slab region of the electro-absorption medium 27.

Although FIG. 5 shows the doped region 40 not extending down to the light insulator 28, the doped region 40 can extend down to the light insulator 28 or into the light insulator 28.

The optical device of FIG. 5 can be constructed using fabrication technologies that are employed in the fabrication of integrated circuits, optoelectronic circuits, and/or optical devices. FIG. 6A through FIG. 6E illustrate a method of forming the modulator of FIG. 5. The method is illustrated using a silicon-on-insulator wafer or chip as the starting precursor for the optical device. However, the method can be adapted to platforms other than the silicon-on-insulator platform.

Figure 6A:
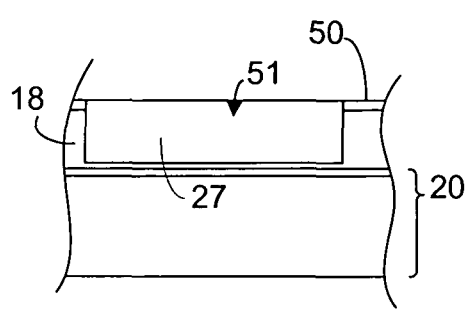
FIG. 6A through FIG. 6E illustrate a method of forming the modulator of FIG. 5.

FIG. 6A illustrate a first mask 50 formed on a silicon-on-insulator wafer or chip to provide a device precursor. FIG. 6A is a cross-section of the device precursor. The first mask 50 leaves exposed a region of the device precursor where an active cavity 51 is to be formed while the remainder of the illustrated portion of the device precursor is protected. The active cavity 51 is the region of the device precursor where the electro-absorption medium 27 will to be formed. A first etch is then performed so as to form the active cavity 51. The first etch is performed for a duration that allows the electro-absorption medium 27 to remain at the bottom of the active cavity 51. A suitable first mask 50 includes, but is not limited to, a hard mask such as a silica mask. A suitable first etch includes, but is not limited to, a dry etch.

The electro-absorption medium 27 is formed in the active cavity 51 so as to provide the device precursor of FIG. 6A. When the light-transmitting medium 18 is silicon and the electro-absorption medium 27 is germanium or germanium-silicon, the active absorption medium 27 can be grown on the seed portion 34 of the light-transmitting medium.

After formation of the electro-absorption medium 27, the first mask 50 can be removed and the device precursor can be planarized. Suitable methods for polishing include, but are not limited to, a chemical-mechanical polishing (CMP) process.

Figure 6B:
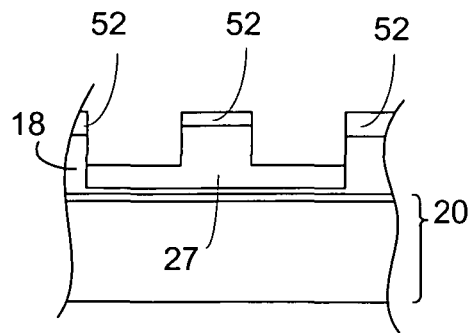

A second mask 52 can be formed on the device precursor as shown on the device precursor of FIG. 6B. The second mask 52 is formed such that the region where the ridge of the electro-absorption medium 27 is to be formed is protected while the remainder of the electro-absorption medium 27 remains exposed. A suitable second mask 52 includes a hard mask such as a silica mask. A second etch is performed so as to provide the device precursor of FIG. 6B. A suitable second etch includes, but is not limited to, a dry etch.

Figure 6C:
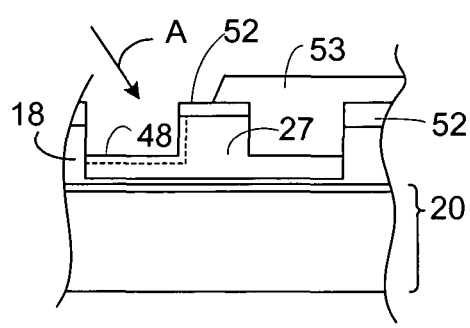

A third mask can be formed so as to protect the electro-absorption medium 27 in one of the slab regions while leaving the other slab region exposed as shown in FIG. 6C. A suitable third mask 53 includes photoresist, silica, and silicon nitride. One of the second doped zones 48 is formed in the electro-absorption medium 27 included in the ridge of the electro-absorption medium and also in the slab region of the electro-absorption medium 27. Suitable methods of forming the second doped zone 48 include, but are not limited to, dopant implantation. As illustrated by the arrow labeled A in FIG. 4E, the direction of the dopant implantation during the formation of the second doped zones 48 can be angled such that the doping for the second doped zone 48 occurs both in the ridge of electro-absorption medium 27 and in the slab region of the electro-absorption medium 27.

Figure 6D:
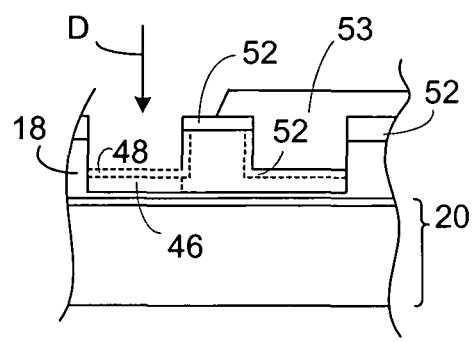
Figure 6E:
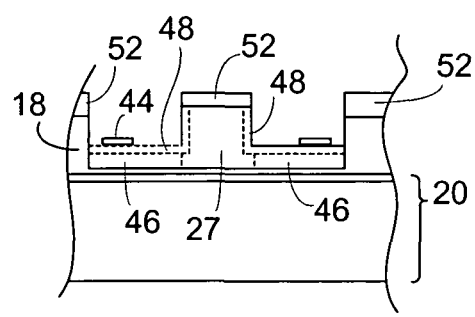

The first doped zone 46 is formed so as to provide the device precursor of FIG. 6D. Suitable methods of forming the first doped zones 46 include, but are not limited to, dopant implantation. As illustrated by the arrow labeled B in FIG. 6D, the direction of the dopant implantation during the formation of the first doped zones 46 can be substantially perpendicular to the surface of the light-transmitting medium at the bottom of the active cavity 51. As a result, first doped zone is located in the slab region of the electro-absorption medium 27 without being substantially present in the ridge of the electro-absorption medium 27. Accordingly, the formation of the first doped zone 46 does not substantially affect the portion of the second doped zone 48 in the ridge of the electro-absorption medium 27. FIG. 6D shows the first doped zone being formed after the second doped zone. In this case, the first doped zone can be formed under the second doped zone such that the first doped zone is adjacent to the second doped zone and/or contacts the second doped zone. The doped zone can be formed under the first zone by increasing the energy used during dopant implantation. As an alternative to forming the first doped zone under the second doped zone, the first doped zone can be formed so it overlaps the second doped zone. For instance, the first doped zone can extend up to the upper surface of the slab region. In these instances, the portion of the resulting doped region having the first doped zone overlapping the second doped zone can show an increased dopant concentration.

The third mask 53 can be removed and the series of steps associated with FIG. 6C and FIG. 6D repeated for the opposite side of the ridge. For instance, a first doped zone and a second doped zone can be formed on the opposite side of the ridge while the first doped zone and the second doped zone that were already formed are protected by a fourth mask (not shown). The electrical conductors 44 are added to provide the modulator of FIG. 6E and FIG. 5. A comparison of FIG. 6E with FIG. 5 shows that a first doped zone 46 and a second doped zone 48 from FIG. 6E combine to serves as each of the doped regions 40 of FIG. 5.

The steps illustrated in FIG. 6A through FIG. 6E need not be performed in the illustrated sequence. For instance, the first doped zone 46 for a doped region 40 can be formed before the second doped zone 48 of that doped region 40.

Figure 7A:
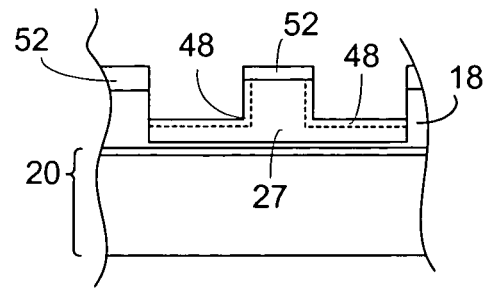
FIG 7A through FIG. 7D illustrate another method of formimg the modulator of FIG. 5.
Figure 7B:
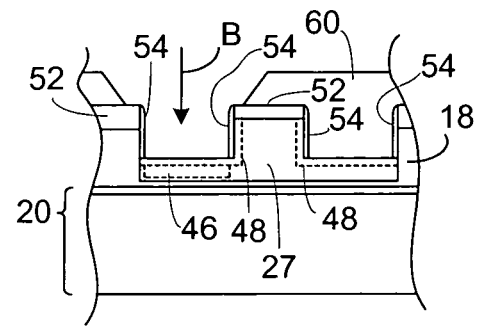

The method of FIG. 6A through FIG. 6E can also mask the sidewalls of the active cavity 51 during the formation of the first doped zones 46. For instance, the n-type and p-type second doped zones 48 can be serially formed on the device precursor of FIG. 6B so as to provide the device precursor of FIG. 7A. A fifth mask 54 can then be formed on the sidewalls of the active cavity 51 as shown in FIG. 7B. Suitable materials for the fifth mask 54 include, but are not limited to, TEOS (tetraethylorthosilicate) as a silicon source, and silicon nitride. The fifth mask 54 can be formed by depositing the fifth mask material on the device precursor of FIG. 6B and dry etching the fifth mask material using a patterned photoresist in order to transfer the pattern of the photoresist onto the fifth mask. Suitable methods for depositing the fifth mask include, but are not limited to, Chemical Vapor Deposition (CVD) and Plasma Enhanced Chemical Vapor Deposition (PECVD).

The photoresist is removed and a sixth mask 55 is formed on the device precursor as shown in Figure of FIG. 7B. The sixth mask 55 protects the slab region of the electro-absorption medium 27 on one side of the ridge while leaving the slab region of the electro-absorption medium 27 on the opposing side of the ridge exposed. The first doped zone 46 can then be formed in the exposed slab region of the electro-absorption medium. Suitable methods of forming the first doped zones 46 include, but are not limited to, dopant implantation. As illustrated by the arrow labeled B in FIG. 7B, the direction of the dopant implantation during the formation of the first doped zones 46 can be substantially perpendicular to the surface of the light-transmitting medium at the bottom of the active cavity 51. However, because the fifth mask 54 protects the sides of the ridge during the formation of the first doped zone, an angled dopant implant can be performed to form the first doped zone 46.

FIG. 7B shows the first doped zone being formed after the second doped zone. In this case, the first doped zone can be formed under the second doped zone such that the first doped zone is adjacent to the second doped zone and/or contacts the second doped zone. The doped zone can be formed under the first zone by increasing the energy used during implantation of the dopant into the first doped zone. As an alternative to forming the first doped zone under the second doped zone, the first doped zone can be formed so it overlaps the second doped zone. For instance, the first doped zone can extend up to the upper surface of the slab region. In these instances, the portion of the resulting doped region having the first doped zone overlapping the second doped zone can show an increased dopant concentration.

Figure 7C:
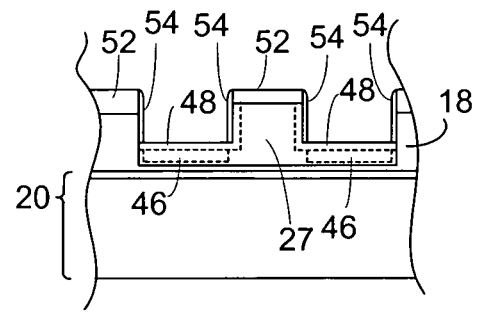

The sixth mask 55 can be removed and the series of steps associated with FIG. 7B repeated for the opposite side of the ridge in order to provide the device precursor of FIG. 7C. For instance, another first doped zone 46 can be formed on the opposite side of the ridge while the first doped zone 46 of FIG. 7B are protected by a seventh mask.

Figure 7D:
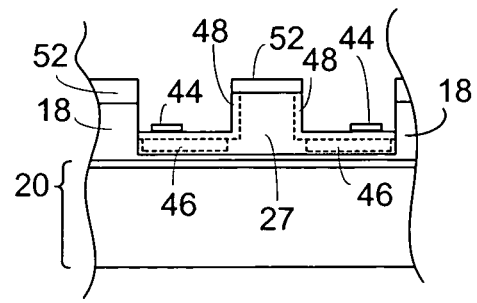

The fifth mask can be removed and the electrical conductors 44 added to provide the modulator of FIG. 7D and FIG. 5. A comparison of FIG. 7D with FIG. 5 shows that a first doped zone 46 and a second doped zone 48 from FIG. 6E combine to serves as each of the doped regions 40 of FIG. 5. Although FIG. 7B through FIG. 7D illustrate one or more of the first doped zones 46 that do not extend down to the base 20, one or more of the first doped zones can extend down to the base or into the base 20.

As discussed in the context of FIG. 2E, problems associated with increasing the thickness of the slab regions need not arise in a modulator constructed according to FIG. 5 because they can be addressed by extending the doped regions 40 further into the slab region. As a result, the slab regions of the electro-absorption medium 27 can be very thick. Accordingly, the etch that defines the ridge of the electro-absorption medium (the second etch of FIG. 6B) can be an intentional under-etch relative to the modulator of FIG. 2E. For instance, the duration of the second etch can be shorter than the etch that is associated with generating slab regions of electro-absorption medium 27 with the thickness of FIG. 2E. By intentionally under-etching during the second etch, the problems with undesirably thin electro-absorption medium 27 slab regions also do not arise. As a result, the method of FIG. 6A through FIG. 7D provides a modulator that is not strongly dependent on the thickness of the slab regions. Without this dependence, the effects of inconstant etching results do not affect the device fabrication and there is less waste in the fabrication process.

As noted above, the first doped zone and the second doped zone that combine to form a single doped region 40 have the same type of dopant. In some instances, the first doped zone and the second doped zone are formed to have substantially the same concentration in order to provide a doped region 40 with a substantially uniform doping concentration. However, the dopant concentration at locations of overlap between the first doped zone and the second zone can increase. Additionally or alternately, there can be other variations in the concentration of the dopant at the interface between a first doped zone and a second zone. Further, as is evident from the above description of the methods, the sequential formation of doped zones can require alignment of masks that are formed sequentially during different doping processes. Because precise alignment of serially formed masks is difficult, the combination of multiple doped zones into a single doped region can be evident from inconsistencies at the perimeter of the doped region. Accordingly, a doped region formed from multiple doped zone can be physically distinguished from a doped region formed from a single doped zone.

The above method descriptions use numerical labels to label different masks. For instance, different masks are called first mask, second, etc. The numerical value does not indicate sequence and instead is used to note different masks. Accordingly, a third mask could be used before a first mask.

Although the modulator is disclosed above as having at least two doped regions on opposing sides of a ridge where the doped regions have similar structures with the exception of dopant type, the doped regions on opposing sides of a ridge can have different structures. Accordingly, a modulator can have only one active region as disclosed above. For instance, a modulator can have a first doped region constructed as disclosed above and a second doped region located on the opposite side of the ridge and that uses a different structure and/or method of construction. Rather than being a second doped region, a more conventional electrical conductor such as a wire or metal trace can replace the second doped region. As a result, the modulator can include a single doped region.

The doped regions can optionally extend to or past the input side of the light-transmitting medium as disclosed in U.S. Patent Application No. 61/572,841. Additionally or optionally, the modulator can be constructed such that the electrical conductors 44 do not contact the doped regions in the electro-absorption medium but instead contact the doped regions in the light-transmitting medium as disclosed in U.S. patent application Ser. No. 13/136,828.

Although FIG. 1A through FIG. 7 disclose doped regions that act as field sources for the modulator, other components can act as field sources. For instance, the doped regions on the lateral sides of the ridge of electro-absorption medium can be replaced with other electrical conductors that act as the source of the electrical field in the electro-absorption. Other suitable electrical conductors include, but are not limited to, conductive metals.

Figure 8:
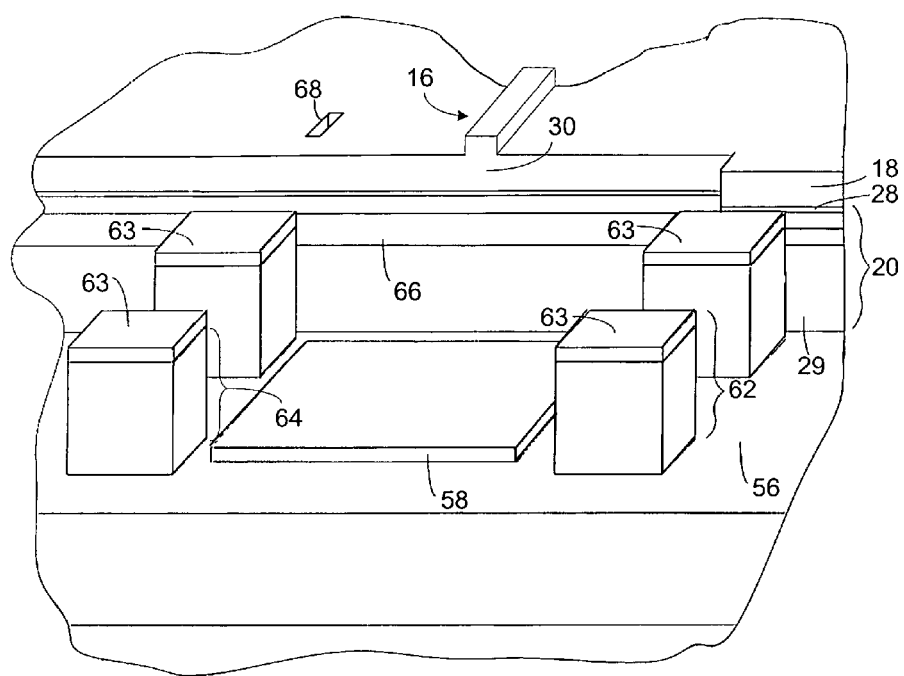
FIG. 8 is a perspective view of a portion of a device suitable for use as the device of FIG. 1A and FIG. 1B.

FIG. 8 is a perspective view of a portion of a device configured to be attached to a laser. The portion of the device of FIG. 1A that is attached to the laser can be constructed as shown in FIG. 8. The laser is not illustrated in FIG. 8 in order to make the portion of the optical device under the laser visible.

A recess extends into the base 20 to form a laser platform 56. A contact pad 58 positioned on the laser platform 56 can be employed for providing electrical communication with a laser on the laser platform 56. One or more stops 62 extend upward from the laser platform 56. For instance, FIG. 8 illustrates four stops 62 extending upward from the laser platform 56. The stops 62 include a cladding 63 positioned on a base portion 64. The substrate 29 can serve as the base portion 64 of the stops 62 and the stop 62 can exclude the light insulator 28 or be made of the same material as the light insulator 28. The portion of the substrate 29 included in the stops 62 can extend from the laser platform 56 up to the level of the light insulator 28. For instance, the stops 62 can be formed by etching through the light insulator 28 and using the underlying substrate 29 as an etch-stop. The cladding 63 can then be formed on the first light-transmitting medium 18 at the same time the cladding 63 is formed on the base portion 64 of the stops 62.

A secondary platform 66 is positioned between the waveguide facet 30 and the laser platform 56. The secondary platform 66 is elevated relative to the laser platform 56. For instance, the secondary platform 66 can be above the laser platform 56 and at or below the level of the light insulator 28. FIG. 8 shows the secondary platform 66 below the level of the light insulator 28; however, the top of the substrate 29 can serve as the secondary platform 66. The secondary platform 66 can be etched at a different time than the portion of the stops 62 that is defined by the substrate 29. Alternately, the secondary platform 66 can be etched concurrently with the base portion 64 of the stops 62 resulting in the secondary platform 66 and the base portion 64 of the stops 62 having about the same height above the laser platform 56.

The optical device includes one or more alignment marks 68. Suitable marks include recesses that extend into the optical device. An alignment mark 68 can extend into the first light-transmitting medium 18 and/or the base. In some instances, one or more of the alignment marks 68 extend into the secondary platform 66. FIG. 8 illustrates an alignment mark 68 extending into the first light-transmitting medium 18. During attachment of a laser to the optical device, each alignment mark 68 can be aligned with one or more secondary alignment marks on a laser in order to achieve horizontal alignment of the laser relative to the optical device.

Suitable lasers include, but are not limited to, Fabry-Perot lasers. A suitable gain medium for use in a Fabry-Perot laser includes, but is not limited to, semiconductors or a combination of semiconductors. One example of a Fabry-Perot laser is a solid-state device having two outer semiconductor layers separated by one or more middle layers and generates laser radiation when charge carriers of opposite polarity, one each from the top and bottom layers, meet in the one or more middle layer.

Although a cladding is not shown on the first light-transmitting medium 18 of the optical device shown in FIG. 8, a cladding can be present over the waveguide and/or in the trenches that define the ridge of the waveguide.

Figure 9A:
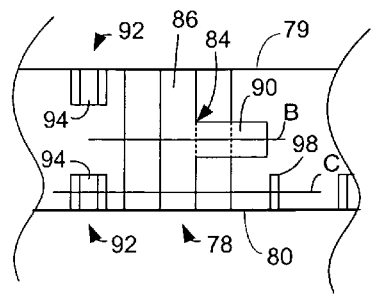
FIG. 9A through FIG. 9D illustrate a Fabry-Perot laser that is suitable for use with an optical device constructed according to FIG. 8.
Figure 9B:
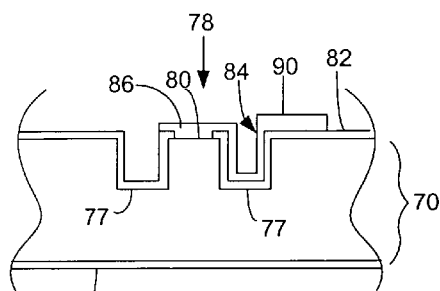
Figure 9C:
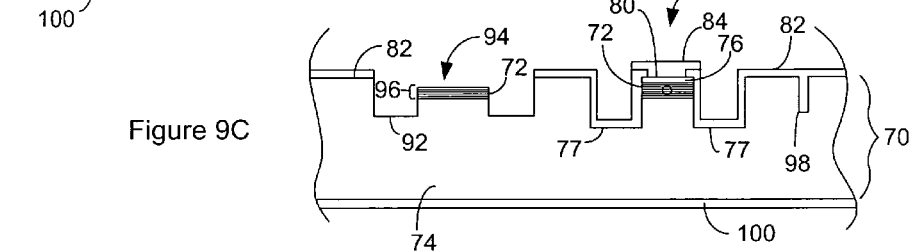
Figure 9D:
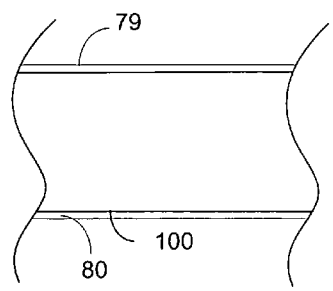

FIG. 9A through FIG. 9D illustrate a Fabry-Perot laser that is suitable for use with an optical device constructed according to FIG. 8. FIG. 9A is a bottom view of the laser. FIG. 9B is a cross-section of the laser shown in FIG. 9A taken along the line labeled B in FIG. 9A. FIG. 9C is a cross-section of the laser shown in FIG. 9A taken along the line labeled C in FIG. 9A. FIG. 9D is a topview of the laser.

The laser is defined in a gain medium 70 where light signals are lased. The gain medium 70 includes sub-layers 72 between a lower gain medium 74 and an upper gain medium 76. The lower gain medium 74 and the upper gain medium 76 can be the same or different. Suitable lower gain media include, but are not limited to, materials that combine one or more group III elements with one or more group IV elements such as InP, InGaAsP, GaSb, GaN, GaAs, $Al_xGa_{(1-x)}As$ where x is 0.1 to 0.4 and combinations thereof. Suitable upper gain media include, but are not limited to, materials that combine one or more group III elements with one or more group IV elements such as InP, InGaAsP, GaSb, GaN, GaAs, $Al_xGa_{(1-x)}As$ where x is 0.1 to 0.4 and combinations thereof. In one example, the lower gain medium 74 and the upper gain medium 76 are each GaAs. As will be discussed in more detail below, each of the sub-layers 72 can have a different composition of a material than the one or more sub-layers 72 that contact that sub-layer 72. In some instances, each of the sub-layers 72 has a different chemical composition. Each sub-layer 72 or a portion of the sub-layers 72 can include or consists of two or more components selected from a group consisting of In, P, Gs, and As. In some instances, the upper gain medium 76 is optional. In one example, the sub-layers 72 alternate GaAs with $Al_xGa_{(1-x)}As$ where x is 0.1 to 0.4. In another example, the lower gain medium 74 and the upper gain medium 76 are each GaAs and the sub-layers 72 alternate GaAs with $Al_xGa_{(1-x)}As$ where x is 0.1 to 0.4.

Trenches 77 extending into the gain medium 70 or proton bombardment define a laser ridge 78 or waveguiding region in the gain medium 70. The laser includes facets through which a light signal can exit gain medium. As is known in the laser arts, the facets of the gain medium 70 can include fully or highly reflective materials and/or partially reflective materials positioned so as to provide amplification of the light signal in the gain medium 70. For instance, FIG. 9C shows a highly reflective component 79 positioned on one of the gain medium facets and a partially reflective component 80 positioned on the other gain medium facet. The partially reflective component 80 is more transmissive that the highly reflective component 79. As a result, the output of the laser exits the gain medium through the partially reflective component 80. Accordingly, the facet of the gain medium that includes the partially reflective component 80 is aligned with the facet 30 (FIG. 8) of the waveguide 16 on the device. In some instances, the partially reflective component 80 is not substantially wavelength selective or is not wavelength selective. Suitable materials for the highly reflective component 79 include, but are not limited to, mirrors or highly reflective layers of material such as metals (e.g. aluminum, gold, silver), or multilayer dielectric coatings such as combinations of zinc sulfide, titanium dioxide and silica. Suitable materials for the partially reflective component 80 include, but are not limited to, partially transmissive and reflective mirrors and partially transmissive and reflective layers of material such as titanium dioxide, silica, hafnia, and magnesium fluoride. In some cases it is not necessary to include a partially reflective component, as the reflection at the facet due to the index difference between the gain medium and the surrounding material results in sufficient reflection.

A laser cladding 82 is positioned on the gain medium 70. A first electrical conductor 84 positioned on the cladding includes a contact region 86 that extends through an opening in the laser cladding 82 into contact with a top of the laser ridge 78. The first electrical conductor 84 extends from the contact region 86 across a trench 77 to a contact pad 90. The contact pad 90 can be employed to apply electrical energy to the laser.

The laser can be positioned adjacent to one or more alignment trenches 92 and/or between alignment trenches 92. For instance, FIG. 9A illustrates the laser adjacent to an alignment trench 92. A secondary stop 94 extends upward from the bottom of the alignment trench 92. The secondary stop 94 can include an alignment layer 96 on top of the lower gain medium 74. The alignment layer 96 can include or consist of one or more sub-layers 72 in contact with one another. The choice of the depth of the alignment layer 96 below the bottom surface of the laser chip determines the vertical alignment between the lasers and the waveguide facets 30.

The alignment layer 96 illustrated in FIG. 9C includes several sub-layers 72. As will be explained in more detail below, these sub-layers 72 can correspond to sub-layers 72 in the laser ridge 78 which can define the location of the laser mode in the laser ridge 78. For instance, each of the sub-layers 72 in an alignment layer 96 can have a different chemical composition from the one or more immediately neighboring sub-layers 72 and/or each of the sub-layers 72 can have a different chemical composition. For instance, the sub-layers 72 can include or consist of a dopant in the gain medium 70. Each sub-layers 72 can have a different dopant and/or dopant concentration from the one or more neighboring sub-layers 72 and/or each of the sub-layers 72 can have a different dopant and/or dopant concentration. As an example, each sub-layer 72 can includes or consists of two or more components selected from a group consisting of In, P, Ga, and As and different sub-layers 72 can have the elements present in different ratios. In another example, each sub-layer 72 includes or consists In, P and none, one, or two components selected from a group consisting of Ga, and As and each of the different sub-layers 72 has these components in a different ratio. Examples of materials that include multiple elements selected from the above group include different compositions of InP with or without dopants such as In(x)P(1-x) or In—Ga—As—P. Additionally, there may be other sub-layers 72 present to compensate for stress due to lattice mismatch between the compositions of the different sub-layers 72. The location of the laser mode in the laser ridge 78 is defined by the different sub-layers 72 as a result of the refractive indices of the different compositions.

Although FIG. 9A through FIG. 9D illustrate a secondary stop 94 extending upward from a bottom of the alignment trench 92 such that walls of the secondary stop 94 are spaced apart from walls of the alignment trench 92, the bottom of the alignment trench 92 can be substantially flat and one or more alignment layers 96 on the bottom of the alignment trench 92 can serve as the secondary stop 94. However, an embodiment having walls of the secondary stop 94 spaced apart from walls of the alignment trench 92 may be preferred to reduce etch induced inconsistencies on the tops of the secondary stops 94.

One or more secondary alignment recesses 98 can extend into the gain medium 70.

An electrically conducting medium 100 can be positioned under the gain medium 70. The electrically conducting medium 100 can be used as a ground for the laser when the electronics apply electrical energy to the laser.

Figure 10A:
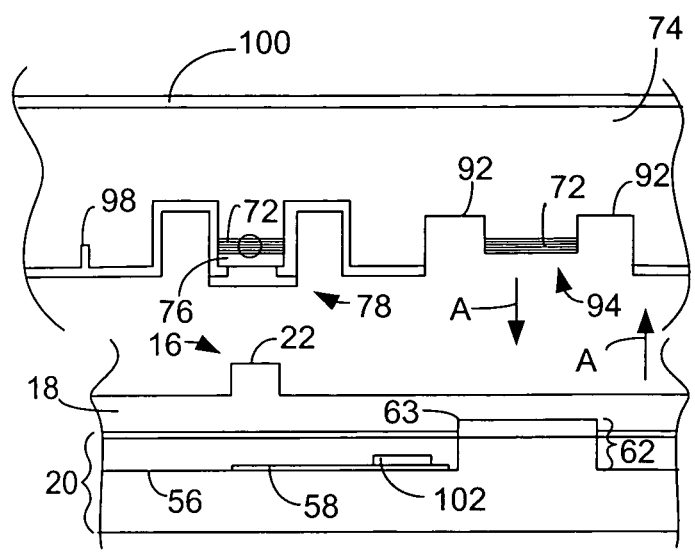
FIG. 10A through FIG. 10C illustrates assembly of the optical system using an optical device constructed according to FIG. 8 and a laser constructed according to FIG. 9A through FIG. 9D.

FIG. 10A illustrates assembly of the optical system using an optical device constructed according to FIG. 8 and a laser constructed according to FIG. 9A through FIG. 9D. The optical device illustrated in FIG. 10A does not show either a cross-sectional view or a sideview. Instead, the view of the optical device 10 shows the relative positions of different features of the optical device when looking at a sideview of the optical device. In contrast, the laser illustrated in FIG. 10A is a cross-sectional view of the laser such as the cross section of FIG. 9C.

The optical system can be assembled by moving the optical device and the laser toward one another as indicated by the arrows labeled A in FIG. 10A. The alignment marks 68 and the secondary alignment recesses 98 are positioned such that they can be aligned with one another during assembly of the optical system. The alignment of these features achieves horizontal alignment of the laser and the optical device. For instance, alignment of these features achieves horizontal alignment of the waveguide facet 30 with the laser facet. Additionally, each of the stops 62 on the optical device is aligned with one of the secondary stops 94 on the laser.

FIG. 10A shows a solder pad 102 positioned on the contact pad 58 on the laser platform 56. The solder pad 102 can be used to immobilize the laser relative to the optical device once the laser is positioned on the optical device. The solder pad 102 can also provide electrical communication between the contact pad 58 on the laser platform 56 and the contact pad 90 on the laser.

Figure 10B:
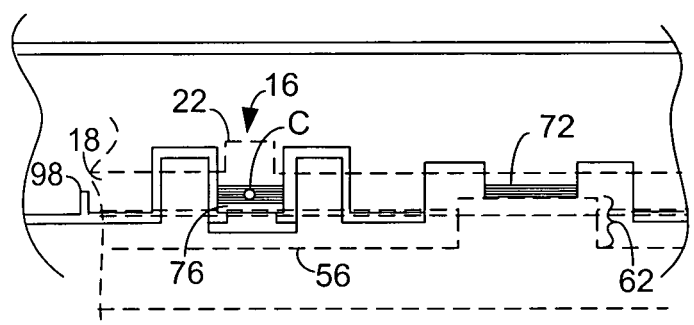
Figure 10C:
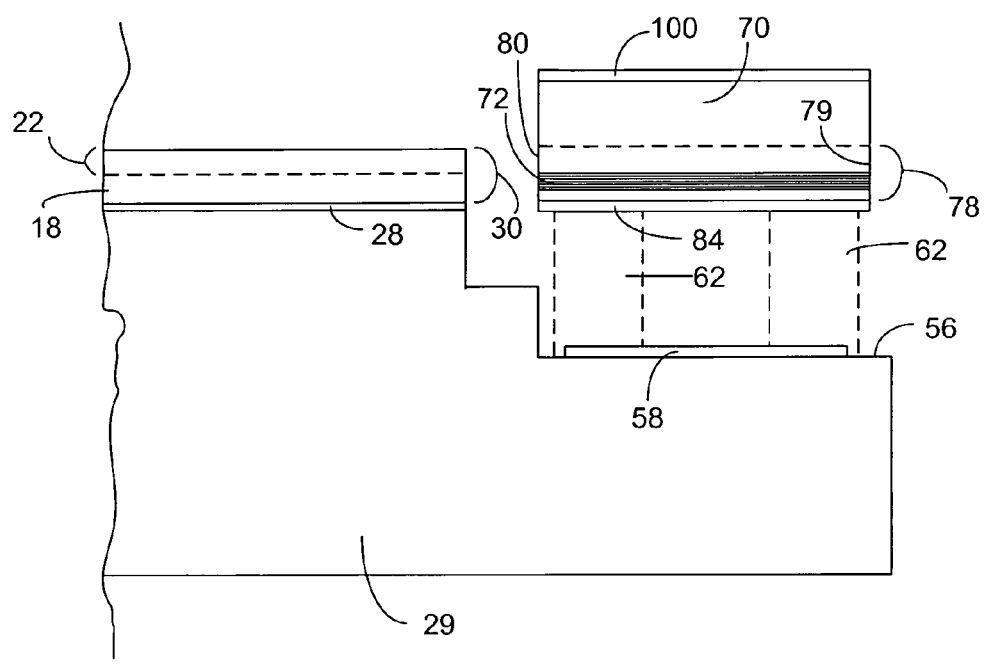

FIG. 10B and FIG. 10C illustrate the optical device of FIG. 10A and the laser of FIG. 10A assembled into an optical system. For the purposes of clarity, in FIG. 10B, the optical device of FIG. 10A is shown by the dashed lines while the laser of FIG. 10A is shown by solid lines. FIG. 10C is a cross section of the system shown in FIG. 10B taken along the longitudinal axis of the waveguide. The solder pads 102 are also removed from FIG. 10B. The dashed lines in FIG. 10C illustrate the location of the stops 62 behind the features that are evident in the cross section.

As is evident in FIG. 10B, each of the stops 62 on the optical device meets one of the secondary stops 94 on the laser. As a result, the vertical movement of the optical device and the laser toward one another is limited by the stops 62 butting against the secondary stops 94. Accordingly, the height of the laser mode relative to the waveguides is a function of the thickness of the alignment layer 96. For instance, increasing the thickness of the alignment layer 96 can elevate the laser mode relative to the waveguide. As a result, the alignment layer 96 is formed to place the laser mode in vertical alignment with the waveguide facet 30. For instance, the circles labeled C in FIG. 10B can illustrate the laser mode and also the desired location for the light signal relative to the waveguide. Since the laser mode and the desired location of the light signal to enter the waveguide overlap, the thickness of the alignment layer 96 is such that the desired alignment of the laser mode and the waveguide is achieved.

Output from the laser can be generated by applying an electrical signal to the gain medium 70 so as to cause an electrical current to flow through the gain medium 70. Accordingly, the electronics 47 operate the laser by applying an electrical signal to the laser so as to generate a potential difference between the contact pad 58 and the electrically conducting medium 100. Accordingly, the electrical signal applied by the electronics 47 serves to pump the laser.

As disclosed above in the context of FIG. 8 through FIG. 10C, the thickness of the alignment layer 96 can affect the vertical alignment of the waveguide facet 30 relative to the laser facet. For instance, vertical alignment can be achieved by achieving a particular height of laser mode relative to the waveguides and since the height of the laser mode relative to the waveguides is a function of the thickness of the alignment layer 96, a method is presented for controlling the thickness of the alignment layer 96. FIG. 10A through FIG. 10B illustrate method of controlling the height of the alignment layer 96 relative to the laser mode. FIG. 10A is a cross-section of a laser such as the cross-section of FIG. 9C and is taken before the formation of the secondary stop 94 is completed. Because the formation of the secondary stop 94 is not completed, the secondary stop 94 includes more sub-layers 72 than are illustrated in FIG. 9C. As evident in FIG. 9C, each of the sub-layers 72 can be included in the secondary stop 94. Each of the sub-layers 72 in the alignment layer 96 of FIG. 10A corresponds to a sub-layer 72 in the laser ridge 78. For instance, each of the sub-layers 72 in the alignment layer 96 of FIG. 10A can have the same chemical composition of one of the sub-layers 72 in the laser ridge 78. Additionally or alternately, each of the sub-layers 72 in the alignment layer 96 of FIG. 10A can be at the same height as the corresponding sub-layers 72 in the laser ridge 78 and/or have the same thickness as the corresponding sub-layers 72 in the laser ridge 78.

Since the sub-layers 72 in the secondary stop 94 each corresponds to a sub-layer 72 in the laser ridge 78 and the sub-layers 72 in the laser ridge 78 define the position of the laser mode in the laser ridge 78, the location of each sub-layer 72 in the secondary stop 94 relative to the laser mode is known.

Each of the sub-layers 72 in the laser ridge 78 can have different chemical composition from the one or more immediately neighboring sub-layers 72 in the laser ridge 78 and/or each of the sub-layers 72 in the laser ridge 78 can have a different chemical composition. For instance, the sub-layers 72 can include or consist of a dopant in the gain medium 70. Each sub-layers 72 can have a different dopant and/or dopant concentration from the one or more neighboring sub-layers 72 and/or each of the sub-layers 72 can have a different dopant and/or dopant concentration. As an example, each sub-layer 72 can includes or consists of two or more components selected from a group consisting of In, P, Ga, and As and different sub-layers 72 can have the elements present in different ratios. In another example, each sub-layer 72 includes or consists In, P and none, one, or two components selected from a group consisting of Ga, and As and each of the different sub-layers 72 has these components in a different ratio. Examples of materials that include multiple elements selected from the above group include different compositions of InP with or without dopants such as In(x)P(1-x) or In—Ga—As—P. Additionally, there may be other sub-layers 72 present to compensate for stress due to lattice mismatch between the compositions of the different sub-layers 72. The location of the laser mode in the laser ridge 78 is defined by the different sub-layers 72 as a result of the refractive indices of the different compositions.

The different compositions of the sub-layers 72 in the unfinished secondary stop 94 of FIG. 10A can be employed to control the thickness of the alignment layer 96. For instance, one or more sub-layers 72 can be removed from the unfinished secondary stop 94 until the alignment layer 96 has the desired thickness. As an example, the top two layers of the unfinished secondary stop 94 of FIG. 10A are removed in order to provide the secondary stop 94 illustrated in FIG. 10B. The one or more sub-layers 72 can be removed by etching. The etch can be chosen such that the sub-layer 72 that will serve as the uppermost sub-layer 72 of the completed alignment layer 96 acts as an etch stop. As a result, the thickness of the alignment layer 96 can be controlled by selecting the sub-layer 72 that will serve as the etch stop and then selecting the appropriate etch. Further, since the height of each sub-layer 72 relative to the laser mode is fixed, the ability to control the thickness of the alignment layer 96 also allows the height of the alignment layer 96 relative to the laser mode to be both known and controlled.

In some instances, before any of the sub-layers 72 are removed from the alignment layer 96, the alignment layer 96 can have more than 3 sub-layers 72, more than 5 sub-layers 72, more than 7 sub-layers 72, or more than 9 sub-layers 72. Accordingly, the laser ridge 78 can have more than 3 sub-layers 72, more than 5 sub-layers 72, more than 7 sub-layers 72, or more than 9 sub-layers 72.

Although FIG. 10A and FIG. 10B illustrate components such as the laser cladding 82 and first electrical conductor 84 in place on the laser at the time the sub-layers 72 are removed from the unfinished secondary stop 94, the sub-layers 72 can be removed from the secondary stop 94 before any, all, or a portion of these components are formed on the laser.

An optical device according to FIG. 8 can be fabricated by etching the ridge for the waveguide. The gap between the alignment portion of the waveguide and the base can then be formed as disclosed in U.S. patent application Ser. No. 08/643,476, filed on May 6, 1996, entitled "Connection Between an Integrated Optical Waveguide and an Optical Fiber," granted U.S. Pat. No. 5,787,214, and incorporated herein in its entirety. The secondary platform 66 and the base portion 64 of the stops 62 can be etched by etching through the first light transmitting medium using an etch for which the light insulator 28 acts as an etch stop followed by etching through the light insulator 28 using an etch for which the substrate 29 acts as an etch stop. The alignment marks 68 can be etched into the first light-transmitting medium 18 and the cladding 63 can be deposited on the first light-transmitting medium 18 and on the base portion 64 of the stops 62. Additional components such as the contact pads and other electrical components can then be formed on the optical device. An additional etch can be used to form the secondary platform 66 below the level of the light insulator 28 (i.e. etch into the substrate 29) but without etching the base portion 64 of the stops 62.

The laser can be generated by purchase from a supplier and/or fabricated using traditional techniques. The system can be assembled by placing the laser on the optical device. In an optical device constructed according to FIG. 8, the height of the stops 62 can be determined from the fabrication process or can be measured. The height of the stops 62 can be combined with the desired height of the laser mode to determine the alignment layer 96 thickness needed to achieve the desired vertical alignment. The sub-layer 72 that would serve as the upper-most sub-layer 72 in an alignment layer 96 having the desired thickness can then be identified. An etch or serial combination of etches that would expose the identified sub-layer 72 without detrimentally etching the identified sub-layer 72 can also be identified. The identified etches can then be performed so as to remove one or more sub-layers 72 above the identified sub-layer 72 and expose the identified sub-layer 72. The laser can then be positioned on the optical device with the stops 62 extending into the alignment trenches 92 and contacting (or butting against) the secondary stops 94 as evident in FIG. 10B.

The above discussions disclose using a first material as an etch stop against an etch configured to etch a second material in contact with the first material. A first material acts as an etch stop when the etch is significantly more corrosive (often called more selective) of the second material than of the first material. As a result, once the etch etches through the second material to the first material, the etch rate drops. Because the etch rate drops, the importance of the etch duration drops and the etch can be executed for a period of time that ensures that the second material will be etched without significantly etching into the first material.

Although the laser is disclosed as having a single laser, a plurality of lasers can be included on a single laser bar as disclosed in U.S. patent application Ser. No. 12/215,693, filed on Jun. 28, 2008, entitled "Interface Between Light Source and Optical Component," and incorporated herein in its entirety. Further, the Optical Device can include multiple waveguide that each ends at a waveguide facet 30 to be aligned with one of the lasers on the laser bar. All or a portion of the waveguides can include a modulator that receives a light signal from one of the lasers as shown in FIG. 1A. Additionally, although the laser can have a bar structure, the laser need not have a bar shape. For instance, the laser can be a one piece device having a laser array or a structure that includes lasers that are immobilized relative to one another before being positioned on the optical device.

Additional details about the construction, operation and fabrication of the optical device and laser illustrated in FIG. 8 through FIG. 10B can be found in U.S. patent application Ser. No. 12/215,693, filed on Jun. 28, 2008, entitled "Interface Between Light Source and Optical Component," and incorporated herein in its entirety.

Suitable electronics 47 for use with the device include, but are not limited to, firmware, hardware and software or a combination thereof. Examples of suitable electronics 47 include, but are not limited to, analog electrical circuits, digital electrical circuits, processors, microprocessors, digital signal processors (DSPs), computers, microcomputers, ASICs, and discrete electrical components, or combinations suitable for performing the required control functions. In some instances, the control electronics 47 includes a memory that includes instructions to be executed by a processing unit during performance of the control and monitoring functions.

An alternative method for mounting a laser on a optical device constructed according to FIG. 1A and FIG. 1B is disclosed in U.S. patent application Ser. No. 08/853,104, filed on May 8, 1997, entitled "Assembly of an Optical Component and an Optical Waveguide, now issued as U.S. Pat. No. 5,881, 190, and incorporated herein in its entirety. The method of fabrication, operation, and mounting disclosed in U.S. patent application Ser. No. 08/853,104 can be use din conjunction with the device and modulator of FIG. 1A and FIG. 1B.

The laser disclosed above is a Fabry-Perot laser using solid state semiconductor as the gain medium. A Fabry-Perot laser can be distinguished from most other laser types because the wavelength in the output of the laser is determined by the material used for the gain medium and the cavity length rather than by a wavelength selective component such as a Bragg grating. In Distributed Bragg Reflector lasers (DBR lasers) or Distributed FeedBack lasers (DFB lasers), a wavelength selective component is used to determine the laser wavelength. As a result, the output wavelength for these lasers is primarily determined by the wavelength transmitted by the wavelength selective component. In contrast, one end of the above laser cavity is defined by a partially reflective component 80 that is not wavelength selective. As a result, the wavelength of the output light is dependent on the material used for the gain medium.

Figure 11A:
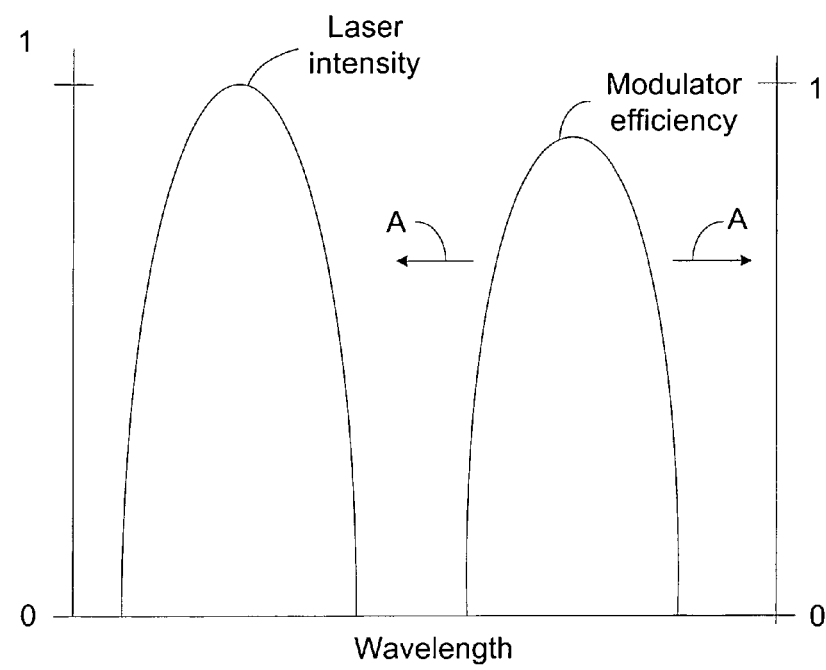
FIG. 11A and FIG. 11B illustrates an intensity versus wavelength profile for a Fabry-Perot laser and an efficiency versus wavelength profile for a Franz-Keldysh modulator.

FIG. 11A illustrates an intensity versus wavelength profile for a Fabry-Perot laser constructed as disclosed above. FIG. 11A also shows a modulation efficiency versus wavelength profile for a Franz-Keldysh modulator constructed as disclosed above. In one example, the efficiency represents the extinction ratio (dB)/loss (dB) where extinction ratio represents the intensity ratio of light lost while operating the modulator so as to attenuate light and loss represents the intensity ratio of light lost while the modulator is not attenuating.

In FIG. 11A, the modulator and the laser are operating at different wavelengths. As a result, when these components are arranged as shown in FIG. 1A, the modulator will not be able to efficiently modulate the output of the laser. The profiles of FIG. 11A can generally be shifted by changing the materials used for these components and/or the ratio of the materials used in the components. For instance, the inventors have found that when the electro-absorption medium 27 in a Franz-Keldysh modulator includes or consists of $Ge_{1-x}Si_x$ (germanium-silicon) where x is greater than or equal to zero, the efficiency versus wavelength profile for the modulator can be shifted by changing the value of x. Increasing the value of x generally shifts the efficiency versus wavelength profile towards shorter wavelengths while decreasing the value of x generally shifts the efficiency versus wavelength profile towards longer wavelengths.

Figure 11B:
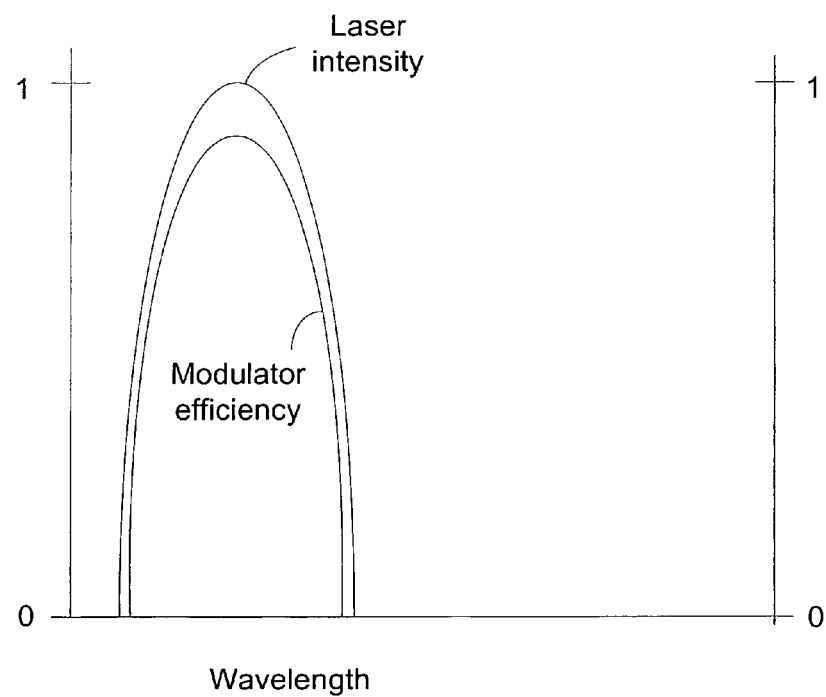

FIG. 11B illustrates the efficiency versus wavelength profile of the modulator shifted such that the modulator can efficiently modulate the output from the laser. For instance, the efficiency versus wavelength profile for the modulator at least partially overlaps the intensity versus wavelength profile for the laser. For certain combinations of gain media and electro-absorption media, this overlap can be achieved by altering the ratio of the materials included in the laser and/or the modulator. The most efficient modulation of the output from the laser occurs when the peak of the efficiency versus wavelength profile of the modulator is the same wavelength as the peak of the intensity versus wavelength profile for the laser. Accordingly, FIG. 11B illustrates the materials for the modulator and laser selected such that the peak of the efficiency versus wavelength profile of the modulator is about the same wavelength as the peak of the intensity versus wavelength profile for the laser. The device is generally used at or around room temperature (~20° C.). However, the temperature of the device is generally elevated relative to the ambient temperature. This temperature elevation can be a result of power consumption by the laser as well as the use of heaters and is generally on the order or 5-25° C. As a result, the materials are preferably selected such that the peak of the efficiency versus wavelength profile is within 10 nm, 5 nm, or 2 nm of the peak of the intensity versus wavelength profile for the laser when the device is at a temperature of 20° C., 40° C., or 70° C.

The profiles illustrated in FIG. 11B shift in response to temperature changes of the device. When the profiles shift in different directions or at different speeds, an arrangement such as is shown in FIG. 11A results and the modulator is no longer able to efficiently modulate the output of the laser. In general, a prior modulator would no longer be able to efficiently modulate the output an FP laser with a temperature shift of as little as about 20° C. The Applicant has found that when the modulator is a Franz-Keldysh modulator and the laser is a Fabry-Perot laser and the materials of these components are wavelength matched such that the modulator can efficiently modulate the output from the laser, for certain combinations of gain media and electro-absorption media the profiles of these components track one another in response to temperature changes.

The Applicant has found that when the modulator is a Franz-Keldysh modulator that uses $Ge_{1-x}Si_x$ (germanium-silicon) as the electro-absorption medium where x is greater than or equal to zero and/or x is less than 0.2, 0.1, or 0.02 and the laser is a Fabry-Perot laser using a gain medium having layers of GaAs and $Al_xGa_{(1-x)}As$ where x is 0.1 to 0.4, and the material variables are selected such that when the device is at a temperature of 40° C., the peak of the peak of the efficiency versus wavelength profile is within 1 nm of the peak of the intensity versus wavelength profile for the laser, the temperature dependency of the laser is about 0.5 nm/° C. and the temperature dependency of the Franz-Keldysh modulator is about 0.75 nm/° C. Accordingly, a temperature shift of 10° C. for both the modulator and the laser increases the differential in the peaks by at most 2.5 nm, a temperature shift of 25° C. for both the modulator and the laser increases the differential in the peaks by at most 6.25 nm. Accordingly, a temperature shift of 10° C. for both the modulator and the laser results in the peak of the efficiency versus wavelength profile being within 5 nm of the peak of the intensity versus wavelength profile; a temperature shift of 40° C. results in the peak of the efficiency versus wavelength profile being within 15 nm of the peak of the intensity versus wavelength profile; a temperature shift of 70° C. results in the peak of the efficiency versus wavelength profile being within 20 nm of the peak of the intensity versus wavelength profile. As a result, the modulator remains capable of working efficiently despite large temperature shifts.

Accordingly, the device can be constructed such that a peak in the efficiency versus wavelength profile for the modulator is within 20 nm of the peak of the intensity versus wavelength profile for the laser both before and after both the modulator and the laser experience a temperature change of more than 35° C., 40° C., 45° C. and/or as high as 60° C., 65° C., 70° C. Additionally or alternately, the device can be constructed such that when the peak of the efficiency versus wavelength profile for the modulator is within 1 nm, 3 nm, or 5 nm of the peak of the intensity versus wavelength profile for the laser when the device is at a temperature of 20, 25, or 30 C and the modulator and laser both experience a temperature shift of more than 70, 60, or 50 C, the peak of the intensity versus wavelength profile for the laser remains within 10 nm, 15 nm, or 20 nm of the peak of the intensity versus wavelength profile for the laser.

The above configurations allow the device to be used in an environment that has substantial temperature swings even though the device excludes temperature control devices and/or devices that stress the device so as to overcome the effects of the temperature changes. Accordingly, in some instances, the device excludes temperature control devices such as heater and/or coolers for heating or cooling the modulator and/or laser. Additionally or alternately, the device can exclude devices that stress the device so as to compensate for the effects of the temperature changes. In some instances, the device excludes temperature control devices that heat and/or cool the modulator and/or laser but includes localized temperature control devices for use in heating and/or cooling other components on the device.

The above discussion discloses a material system that includes $Ge_{1-x}Si_x$ (germanium-silicon) as the electro-absorption medium and GaAs and $Al_xGa_{(1-x)}As$ as the gain miedum; however, other material systems are possible. For instance, using InGaAsP and InP in the gain medium may result in a gain medium that produces a laser with a temperature dependence that is similar to a laser using GaAs and $Al_xGa_{(1-x)}As$. Potential material systems can be identified by through experimental determination of peak wavelength versus temperature using an optical spectrum analyzer or other wavelength selective instrument.

Although FIG. 1A shows a portion of the waveguide 16 located between the laser and the modulator, the waveguide need not be positioned between the laser and the modulator. For instance, the modulator and/or electro-absorption medium can receive the laser output from the laser without the laser output traveling through any portion of the waveguide.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical system, comprising:
a Fabry-Perot laser positioned on a base and including a gain medium from which an output light signal is generated;
a modulator positioned on the base,
the modulator including an electro-absorption medium configured to receive at least a portion of the output light signal from the laser,
the electro-absorption medium and the gain medium being different materials,
field sources that serve as a source of an electrical field in the electro-absorption medium,
the electro-absorption medium being a medium in which the Franz-Keldysh effect occurs in response to the formation of the electrical field in the electro-absorption medium; and
a peak in an efficiency versus wavelength profile of the modulator being within 20 nm of the peak of the intensity versus wavelength profile for the laser both before and after both the modulator and the laser experience a temperature change of more than 70° C.

2. The system of claim 1, wherein the peak in the efficiency versus wavelength profile of the modulator is within 15 nm of the peak of the intensity versus wavelength profile for the laser both before and after both the modulator and the laser experience a temperature change of more than 70° C.

3. The system of claim 2, wherein the peak in the efficiency versus wavelength profile of the modulator is within 10 nm of the peak of the intensity versus wavelength profile for the laser both before and after both the modulator and the laser experience a temperature change of more than 70° C.

4. The system of claim 1, wherein when the peak of the efficiency versus wavelength profile for the modulator is within 5 nm of the peak of the intensity versus wavelength profile for the laser when the modulator and laser are at a temperature of 25° C.

5. The system of claim 4, wherein when the modulator and laser are at the temperature 25° C. and the modulator and laser both experience a temperature shift of more than 70° C., the peak of the intensity versus wavelength profile for the laser remains within 20 nm of the peak of the intensity versus wavelength profile for the modulator.

6. The system of claim 1, wherein the gain medium includes $Ge_{1-x}Si_x$ where x is in a range of 0 to 0.4.

7. The system of claim 1, wherein the gain medium includes GaAs.

8. The system of claim 7, wherein the gain medium includes $Al_xGa_{(1-x)}As$ and x is 0.1 to 0.4.

9. The system of claim 1, wherein a ridge of the gain medium extends upwards from slab regions positioned on opposing sides of the ridge,
the ridge including lateral sides connected to a top of the ridge, and
the field sources contacting the lateral sides on opposing sides of the ridge.

10. The system of claim 9, wherein doped region of the gain medium serve as the field sources.

11. The system of claim 1, wherein a ridge of the gain medium extends upwards from slab regions positioned on opposing sides of the ridge,
   the field sources include doped regions of the gain medium positioned on opposing sides of the ridge.

12. The system of claim 1, wherein the base includes a silicon substrate of a silicon-on-insulator wafer.

13. The system of claim 1, further comprising:
   a waveguide positioned on the base so as to receive a modulated light signal from the modulator, the waveguide configured to guide the received light signal through a light-transmitting medium.

14. The system of claim 13, wherein the waveguide is partially defined by a ridge of the light-transmitting medium extending upward from the base.

15. The system of claim 14, wherein a portion of the light-transmitting medium is located between the gain medium and the base.

16. The system of claim 1, wherein the base is the base of a planar optical device.

\* \* \* \* \*